(12) United States Patent
Sugie

(10) Patent No.: US 11,575,307 B2
(45) Date of Patent: Feb. 7, 2023

(54) DRIVE DEVICE

(71) Applicant: ROHM Co., LTD., Kyoto (JP)

(72) Inventor: Hisashi Sugie, Kyoto (JP)

(73) Assignee: ROHM CO., LTD., Kyoto (JP)

( * ) Notice: Subject to any disclaimer, the term of this patent is extended or adjusted under 35 U.S.C. 154(b) by 0 days.

(21) Appl. No.: 17/510,577

(22) Filed: Oct. 26, 2021

(65) Prior Publication Data

US 2022/0131455 A1    Apr. 28, 2022

(30) Foreign Application Priority Data

Oct. 28, 2020  (JP) .............................. JP2020-180325

(51) Int. Cl.
| | | |
|---|---|---|
| *H02M 1/08* | (2006.01) | |
| *H03K 17/687* | (2006.01) | |
| *H02M 1/00* | (2006.01) | |
| *B60R 16/033* | (2006.01) | |
| *H02P 27/06* | (2006.01) | |

(52) U.S. Cl.
CPC ............ *H02M 1/08* (2013.01); *H02M 1/0009* (2021.05); *H03K 17/6871* (2013.01); *B60R 16/033* (2013.01); *H02P 27/06* (2013.01); *H03K 2217/0063* (2013.01); *H03K 2217/0072* (2013.01)

(58) Field of Classification Search
CPC .... H02M 1/08; H02M 1/0009; H02M 3/1588; H02M 7/5395; H02M 1/0029; H02M 1/0051; H03K 17/6871; H03K 2217/0063; H03K 2217/0072; H03K 2217/0027; H03K 17/165; H03K 17/04206; B60R 16/033; H02P 27/06
See application file for complete search history.

(56) References Cited

U.S. PATENT DOCUMENTS

| | | | |
|---|---|---|---|
| 10,218,258 B1* | 2/2019 | Nagl | H02M 1/08 |
| 10,938,381 B1* | 3/2021 | Jiang | H03K 5/04 |
| 2019/0265744 A1* | 8/2019 | Tajima | G01R 19/165 |
| 2020/0195121 A1* | 6/2020 | Keskar | H03K 17/6871 |
| 2021/0021121 A1* | 1/2021 | Lee | G01R 31/27 |

FOREIGN PATENT DOCUMENTS

JP    2019122116    7/2019

* cited by examiner

*Primary Examiner* — Metasebia T Retebo
(74) *Attorney, Agent, or Firm* — Chip Law Group

(57) ABSTRACT

A drive device includes a driver configured to drive a high-side transistor and a low-side transistor; a first current detecting part for detecting one of an upper-side current that flows to the high-side transistor and a lower-side current that flows to the low-side transistor; a first current determining part that detects a sign of switching of a forward direction/reverse direction of the upper-side current or the lower-side current detected by the first current detecting part or the switching per se; and a slew rate adjusting part configured to control the driver such that a slew rate of the high-side transistor or the low-side transistor is adjusted according to a determination result of the first current determining part.

11 Claims, 8 Drawing Sheets t1 t2 t3 t4

PRIOR ART

PRIOR ART

DRIVE DEVICE

CROSS REFERENCE TO RELATED APPLICATIONS

This application claims priority benefit of Japanese Patent Application No. JP 2020-180325 filed in the Japan Patent Office on Oct. 28, 2020. Each of the above-referenced applications is hereby incorporated herein by reference in its entirety.

BACKGROUND

A technology disclosed in the present specification relates to a drive device that drives a load typified by a motor.

In the past, the pulse width modulation (PWM) control system has been employed in drive devices (including a driver used for driving a load such as a motor and a power supply device that supplies power to a load).

In the PWM control system, the load is driven by adjustment of the duty ratio (on-time)/(PWM cycle) in the PWM cycle when a high-side transistor and a low-side transistor are complementarily turned on/off.

When a transistor switches from the off-state to the on-state, the direction of the current in the body diode of the transistor switches from the forward direction to the reverse direction. This operation is referred to as the reverse recovery of the body diode, and the current that flows in the reverse direction is referred to as the reverse recovery current.

FIGS. 1A and 1B are diagrams illustrating the reverse recovery waveform of a body diode. FIG. 1A illustrates a current that flows in the body diode in which the forward direction is defined as the positive direction. FIG. 1B illustrates the anode-cathode voltage. A reverse direction bias voltage is applied at a clock time t1, and the forward direction current decreases with a certain slope (−dIf/dt) and becomes zero at a clock time t2. Thereafter, the reverse recovery current becomes a peak value IRR at a clock time t3, and the current increases in the forward direction with a certain slope (dIR/dt) until a clock time t4. The time from the clock time t2 to the clock time t4 is the reverse recovery time trr, and what is obtained by integrating the reverse recovery current with the reverse recovery time trr is referred to as the reverse recovery charge QRR. A reverse voltage VR is applied at and after the clock time t4.

An example of the related art is disclosed in Japanese Patent Laid-open No. 2019-122116.

SUMMARY

FIG. 2 is a block diagram illustrating the configuration of a related-art drive device for which a motor is the load. A drive device 1 (see dashed line frames) illustrated in FIG. 2 includes a predriver 11, a current sense amplifier 12, and a sense resistor 13, and a high-side transistor 2 and a low-side transistor 3 are externally mounted thereon.

The predriver 11 receives a slew rate control signal and a logic control signal from a logic part (not illustrated). The control signal adjusts, for example, the current value of a current mirror and the size of an inverter included in the predriver 11 and controls the slew rate when the high-side transistor 2 and the low-side transistor 3 are turned on/off. For example, the logic control signal controls the timing at which the high-side transistor 2 and the low-side transistor 3 are turned on/off.

The current sense amplifier 12 transmits a logic signal to a logic block according to voltages generated at both ends of the sense resistor 13. When a motor is the load, the logic signal output from the current sense amplifier 12 can be used for controlling the rotation speed of the motor and adjusting a current.

The sense resistor 13 is provided, in a connected manner, between a node OUT that is a common node of the high-side transistor 2 and the low-side transistor 3 and a node Load coupled to the load, and generates a voltage to be transmitted to the current sense amplifier 12 between the two terminals.

The high-side transistor 2 and the low-side transistor 3 are N-channel metal oxide semiconductor field effect transistors (MOSFETs), and gates HG and LG of them are connected to the predriver 11. The drain of the high-side transistor 2 is connected to a supply voltage, and the source of the low-side transistor 3 is grounded. The source of the high-side transistor 2 and the drain of the low-side transistor 3 are connected to each other in common and are connected to one end of the above-described sense resistor 13. Further, a signal of a High level or Low level is generated at the node OUT.

The high-side transistor 2 and the low-side transistor 3 have a body diode. When the high-side transistor 2 or the low-side transistor 3 changes from the off-state to the on-state, reverse recovery operation is caused, and the direction of the current that flows in the body diode switches from the forward direction to the reverse direction.

The larger the absolute value of the certain slope (−dIf/dt) is, the larger the peak value IRR of the reverse recovery current becomes. In switching operation, this reverse recovery current appears as a through-current. The through-current shortens the lifetime of the high-side transistor 2 and the low-side transistor 3, making them deteriorate early. Further, an output voltage OUT becomes unstable and ringing occurs in some cases.

As a method for coping with such a problem, there is a technique in which the slew rate of the high-side transistor 2 and the low-side transistor 3 is lowered by lowering of the driving capability of the predriver 11. However, the time taken for turning-on and the time taken for turning-off becomes long, and problems such as deterioration of the power efficiency and deterioration of the controllability arise.

A drive device disclosed in the present specification has the following configuration (first configuration). The drive device includes a driver configured to drive a high-side transistor and a low-side transistor, a first current detecting part for detecting one of an upper-side current that flows to the high-side transistor and a lower-side current that flows to the low-side transistor, a first current determining part that detects a sign of switching of a forward direction/reverse direction of the upper-side current or the lower-side current detected by the first current detecting part or the switching per se, and a slew rate adjusting part configured to control the driver such that the slew rate of the high-side transistor or the low-side transistor is adjusted according to a determination result of the first current determining part.

Further, the drive device with the above-described first configuration may have a configuration in which the first current detecting part is a first detection resistor and the first current determining part includes a first comparator that compares a voltage generated at one end of the first detection resistor and a voltage generated at the other end of the first detection resistor (second configuration).

Further, the drive device with the above-described second configuration may have a configuration in which the first detection resistor is an integrated wiring resistor (third configuration).

Further, the drive device with the above-described second configuration may have a configuration in which the first detection resistor is not integrated but externally mounted (fourth configuration).

Further, the drive device with the above-described first to fourth configurations may have a configuration of further including a second current detecting part that detects the other current that is not detected by the first current detecting part in the upper-side current and the lower-side current (fifth configuration).

Further, the drive device with the above-described fifth configuration may have a configuration of further including a second current determining part that detects a sign of switching of the forward direction/reverse direction of the upper-side current or the lower-side current detected by the second current detecting part or the switching per se (sixth configuration).

Further, the drive device with the above-described sixth configuration may have a configuration in which the second current detecting part is a second detection resistor and the second current determining part includes a second comparator that compares a voltage generated at one end of the second detection resistor and a voltage generated at the other end of the second detection resistor (seventh configuration).

Further, the drive device with the above-described seventh configuration may have a configuration in which the second detection resistor is an integrated wiring resistor (eighth configuration).

Further, the drive device with the above-described seventh configuration may have a configuration in which the second detection resistor is not integrated but externally mounted (ninth configuration).

Further, the drive device with the above-described fifth to ninth configurations may have a configuration of further including a current sense amplifier that senses the upper-side current and the lower-side current by using the first current detecting part and the second current detecting part (tenth configuration).

Furthermore, a vehicle disclosed in the present specification has a configuration of including the drive device with any one of the above-described first to tenth configurations (eleventh configuration).

According to an embodiment of the present technology, performing driving by taking into consideration the reverse recovery characteristic in the body diode of the transistor enables safe driving of the drive device and enhancement in the power efficiency.

BRIEF DESCRIPTION OF THE DRAWINGS

FIGS. 4A, 4B and 4C are waveform diagrams of the respective nodes at the time of a transition to the on-state of a high-side transistor (low slew rate is fixed);

FIGS. 5A, 5B and 5C are waveform diagrams of the respective nodes at the time of a transition to the on-state of the high-side transistor (high slew rate is fixed);

FIGS. 6A, 6B and 6C are waveform diagrams of the respective nodes at the time of a transition to the on-state of the high-side transistor (slew rate is switched);

FIG. 7 is a waveform diagram and an enlarged view in which

DETAILED DESCRIPTION OF THE PREFERRED EMBODIMENT

First Embodiment

Figure 3:
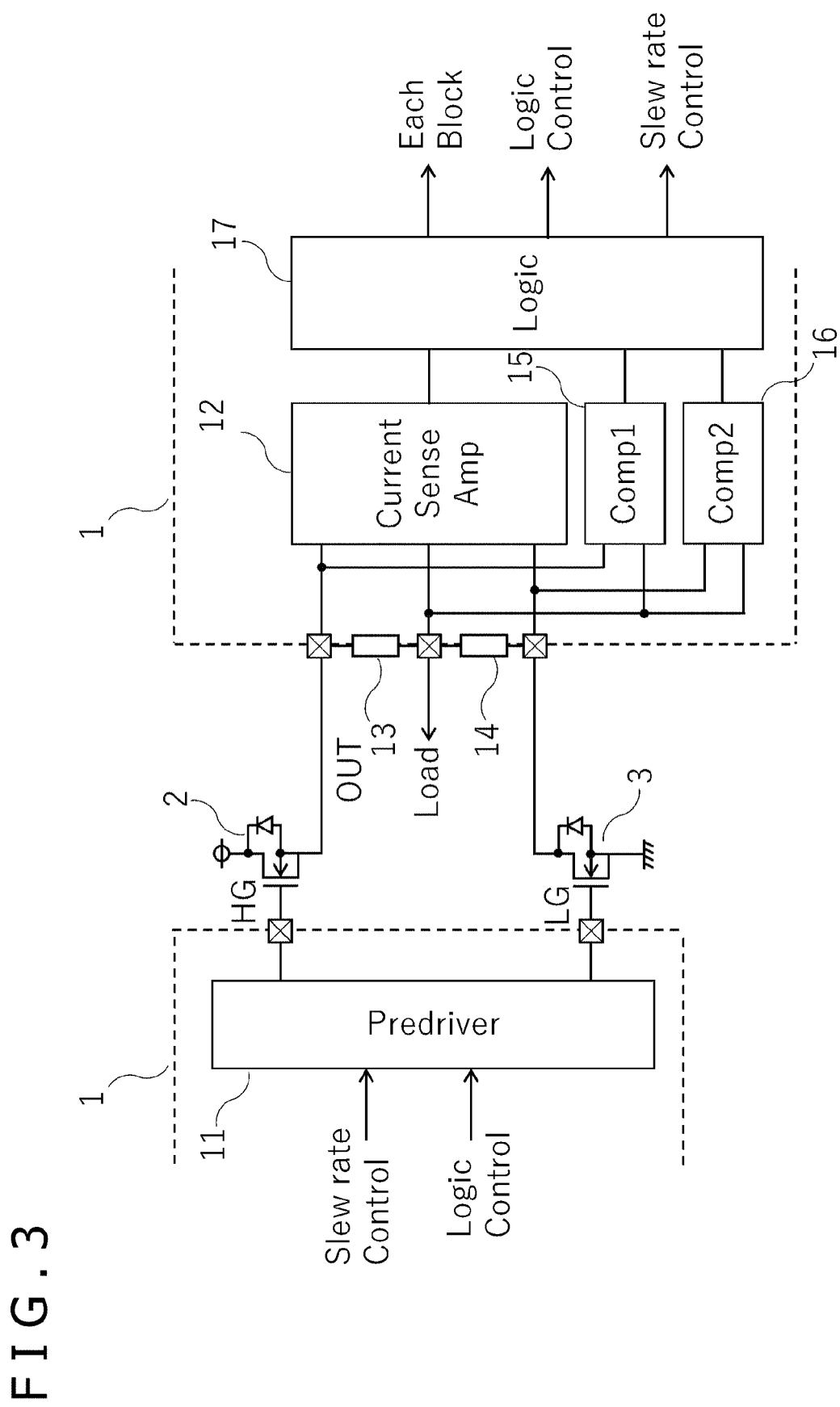
FIG. 3 is a block diagram illustrating one configuration example of a drive device according to an embodiment of the present technology.

FIG. 3 is a block diagram illustrating one configuration example of a drive device according to an embodiment of the present technology. A drive device 1 (see dashed line frames) illustrated in FIG. 3 is a semiconductor device (what is generally called a motor driver integrated circuit (IC)) that includes a predriver 11, a current sense amplifier 12, sense resistors 13 and 14, a first comparator 15, a second comparator 16, and a logic part 17 and on which a high-side transistor 2 and a low-side transistor 3 are externally mounted.

The predriver 11 receives a slew rate control signal and a logic control signal from the logic part 17. Signals generated in the logic part 17, such as the logic control signal, are sent also to the respective blocks other than the predriver 11. The slew rate control signal adjusts, for example, the current value of a current mirror and the size of an inverter included in the predriver 11 and controls the slew rate when the high-side transistor 2 and the low-side transistor 3 are turned on/off. For example, the logic control signal controls the timing at which the high-side transistor 2 and the low-side transistor 3 are turned on/off.

The current sense amplifier 12 transmits a logic signal to the logic part 17 according to voltages generated at both ends of the sense resistor 13 and the sense resistor 14. When a motor is the load, the logic signal output from the current sense amplifier 12 can be used for controlling the rotation speed of the motor and adjusting a current.

The sense resistor 13 is provided in a connected manner between the high-side transistor 2 and a node Load coupled to the load and generates, between the two terminals, a voltage to be transmitted to the current sense amplifier 12 and the first comparator 15 to be described later. The sense resistor 13 is equivalent to a first current detecting part for detecting an upper-side current that flows in the high-side transistor 2.

The sense resistor 14 is provided in a connected manner between the node Load coupled to the load and the low-side transistor 3 and generates, between the two terminals, a voltage to be transmitted to the current sense amplifier 12 and the second comparator 16 to be described later. The sense resistor 14 is equivalent to a second current detecting part for detecting a lower-side current that flows in the low-side transistor 3.

In the present embodiment, the sense resistors 13 and 14 are integrated wiring resistors. Moreover, the sense resistors 13 and 14 may be poly resistors or other resistors integrated into the drive device 1 or may be discrete parts externally mounted on the drive device 1. Further, as the above-described first current detecting part and second current detecting part, besides using the sense resistors 13 and 14, respectively, using magneto-impedance (MI) sensors or other sensors to detect a current in a contactless manner is also possible.

The first comparator 15 compares the voltage generated at the node OUT and the voltage generated at the node Load and transmits the comparison result to the logic part 17. The first comparator 15 detects the current of a body diode whose direction switches when the high-side transistor 2 is turned on/off. The first comparator 15 detects the timing of switching from the forward direction current to the reverse direction current at the clock time t1 or the timing of switching of the polarity of the current at the clock time t2 in FIGS. 1A and 1B, for example, and transmits the timing to the logic part 17 at the subsequent stage. Besides, the first comparator 15 may detect a sign of switching from the forward direction current to the reverse direction current before the clock time t1.

Figure 1A:
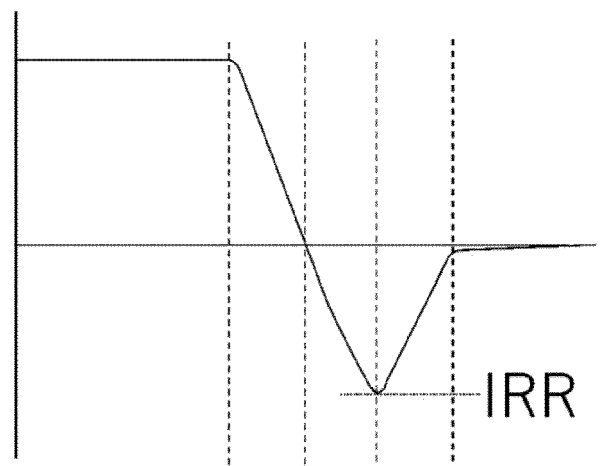
FIGS. 1A and 1B are waveform diagrams illustrating the reverse recovery characteristic of a body diode.
Figure 1B:
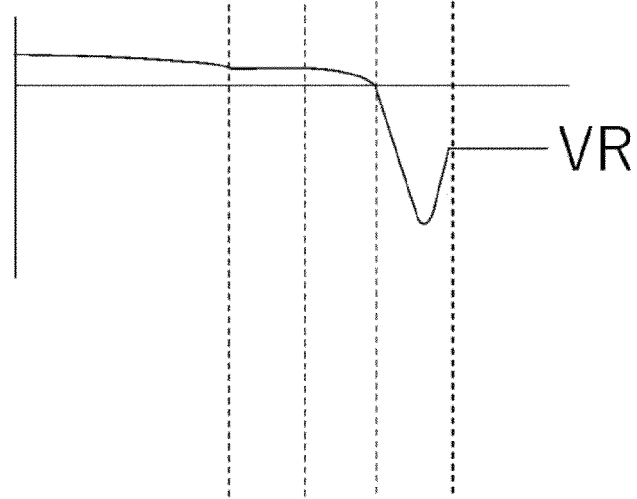
Figure 2:
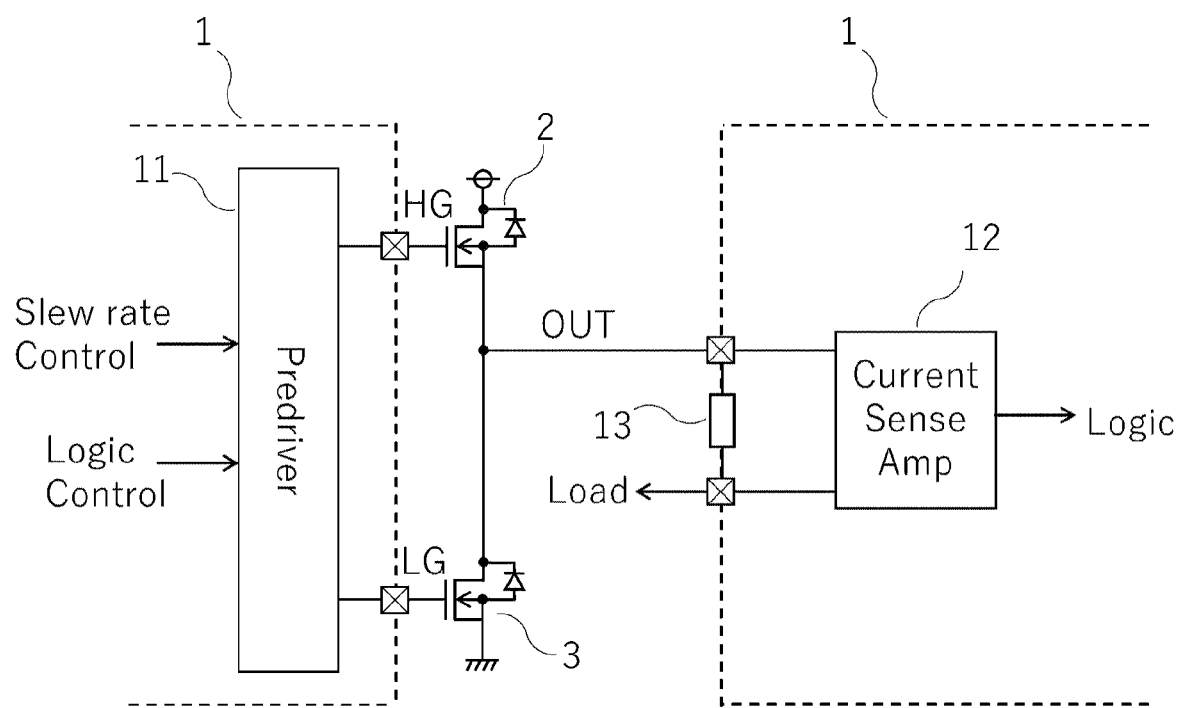
FIG. 2 is a block diagram illustrating a configuration example of a related-art drive device.

The second comparator 16 compares the voltage generated at the node Load and the voltage generated at one end (in the example of this diagram, drain) of the low-side transistor 3 and transmits the comparison result to the logic part 17. The second comparator 16 detects the current of a body diode whose direction switches when the low-side transistor 3 is turned on/off. The second comparator 16 detects the timing of switching from the forward direction current to the reverse direction current at the clock time t1 or the timing of switching of the polarity of the current at the clock time t2 in FIGS. 1A and 1B, for example, and transmits the timing to the second comparator 16 may detect a sign of switching from the forward direction current to the reverse direction current before the clock time t1. For example, a comparator or other comparators for which a certain voltage at a certain clock time in the period between the clock time t1 and the clock time t2 in FIGS. 1A and 1B is set as a threshold may be used. This similarly applies to the case of the high-side transistor.

The logic part 17 receives the logic signal from the current sense amplifier 12 and the comparison results from the first comparator 15 and the second comparator 16 and sends the logic control signal and the slew rate control signal to the predriver 11.

The slew rate control signal is sent to the predriver 11 to adjust the slew rate of the high-side transistor 2 according to a signal from the second comparator 16 that has detected the timing of switching from the forward direction current to the reverse direction current in the body diode of the low-side transistor 3. Specifically, for example, by setting the current that flows into the gate of the high-side transistor 2 small, the slew rate of the high-side transistor 2 is adjusted in such a manner that the absolute value of the certain slope (−dIf/dt) in the reverse recovery characteristic described with FIGS. 1A and 1B is set small. Also in the low-side transistor 3, similarly, the slew rate control signal is sent to the predriver 11 to adjust the slew rate of the low-side transistor 3 according to a signal from the first comparator 15 that has detected the timing of switching of the current of the body diode of the high-side transistor 2.

Effects of the present technology will be described in detail below by taking as an example the case in which the high-side transistor 2 makes a transition from the off-state to the on-state.

FIGS. 4A to 4B are waveform diagrams of the respective nodes when a transition is made from the off-state to the on-state under a condition in which the slew rate of the high-side transistor 2 is low (current that flows into the gate is several milliamperes).

FIG. 4A illustrates the current that flows into the gate of the high-side transistor 2; the ordinate axis indicates the current value, and the abscissa axis indicates the time. A drive signal according to the logic control signal is sent from the predriver 11 to the gate of the high-side transistor 2 at a clock time t1', and the high-side transistor 2 attempts to make a transition from the off-state to the on-state.

FIG. 4B illustrates a current regarding which the direction from the current sense amplifier 12 toward the one end of the low-side transistor 3 is defined as the positive direction. That is, the forward direction in the body diode of the low-side transistor 3 is the negative polarity, and the reverse direction is the positive polarity. According to FIG. 4B, the current in the negative direction takes a long time to slowly decrease from the clock time t1', the current value becomes zero at a clock time t2', and the peak value of the reverse current that flows in the positive direction is a very small value. This is because the transition of the state is made under the condition in which the slew rate is low.

FIG. 4C illustrates the voltage at the node Load. The voltage at the node Load becomes the voltage of the High level when the high-side transistor 2 is turned on, and becomes the voltage of the Low level when the low-side transistor 3 is turned on. According to FIG. 4C, the voltage at the node Load begins to rise up at the clock time t2'. That is, a period DeadTime in which the high-side transistor 2 and the low-side transistor 3 are in the off-state is long. Thus, deterioration of the power efficiency can be seen.

FIGS. 5A to 5C are waveform diagrams of the respective nodes when a transition is made from the off-state to the on-state under a condition in which the slew rate of the high-side transistor 2 is high (current that flows into the gate is several tens of milliamperes).

FIG. 5A illustrates the current that flows into the gate of the high-side transistor 2; the ordinate axis indicates the current value, and the abscissa axis indicates the time. A drive signal according to the logic control signal is sent from the predriver 11 to the gate of the high-side transistor 2 at the clock time t1', and the high-side transistor 2 attempts to make a transition from the off-state to the on-state. After the current rises up at the clock time t1', the current gradually decreases from a clock time t3'.

FIG. 5B illustrates the current regarding which the direction from the current sense amplifier 12 toward the one end of the low-side transistor 3 is defined as the positive direction. According to FIG. 5B, the current that flows in the negative direction suddenly decreases at a clock time t4' and becomes zero at a clock time t5'. Moreover, the current turns to the positive direction, and the peak value of the reverse current is a very large value. This is because the transition of the state is made under the condition in which the slew rate is high.

FIG. 5C illustrates the voltage at the node Load. According to FIG. 5C, the voltage at the node Load sharply rises up at the clock time t4', and there is a possibility that ringing is caused.

FIGS. 6A to 6C are waveform diagrams of the respective nodes in the case in which, when the high-side transistor 2 makes a transition from the off-state to the on-state, switching is carried out from a condition in which the slew rate is high (current that flows into the gate is several tens of milliamperes) to a condition in which the slew rate is low (current that flows into the gate is several milliamperes).

FIG. 6A illustrates the current that flows into the gate of the high-side transistor 2; the ordinate axis indicates the current value, and the abscissa axis indicates the time. A drive signal according to the logic control signal is sent from the predriver 11 to the gate of the high-side transistor 2 at the clock time t1', and the high-side transistor 2 attempts to make a transition from the off-state to the on-state. After the current rises up at the clock time t1', the condition is switched to one in which the slew rate is low at the clock time t4'.

FIG. 6B illustrates the current regarding which the direction from the current sense amplifier 12 toward the one end of the low-side transistor 3 is defined as the positive direction. According to FIG. 6B, the current that flows in the negative direction suddenly decreases at the clock time t4' and becomes zero at the clock time t5'. At this time, the second comparator 16 detects that the current of the body diode has switched from the forward direction to the reverse direction. As a result, the condition is switched to one in which the slew rate is low. Thus, the peak value of the reverse current that should have originally risen as in FIG. 5(B) is suppressed.

FIG. 6C illustrates the voltage at the node Load. According to FIG. 6C, the voltage at the node Load begins to rise up at the clock time t4' and gently rises from the clock time t5' at which the condition is changed to one in which the slew rate is low, to become the voltage of the High level. The possibility that ringing is caused can be suppressed by switching the condition of the slew rate. Moreover, Dead-Time can also be shortened unlike in FIG. 4C.

Figure 4:
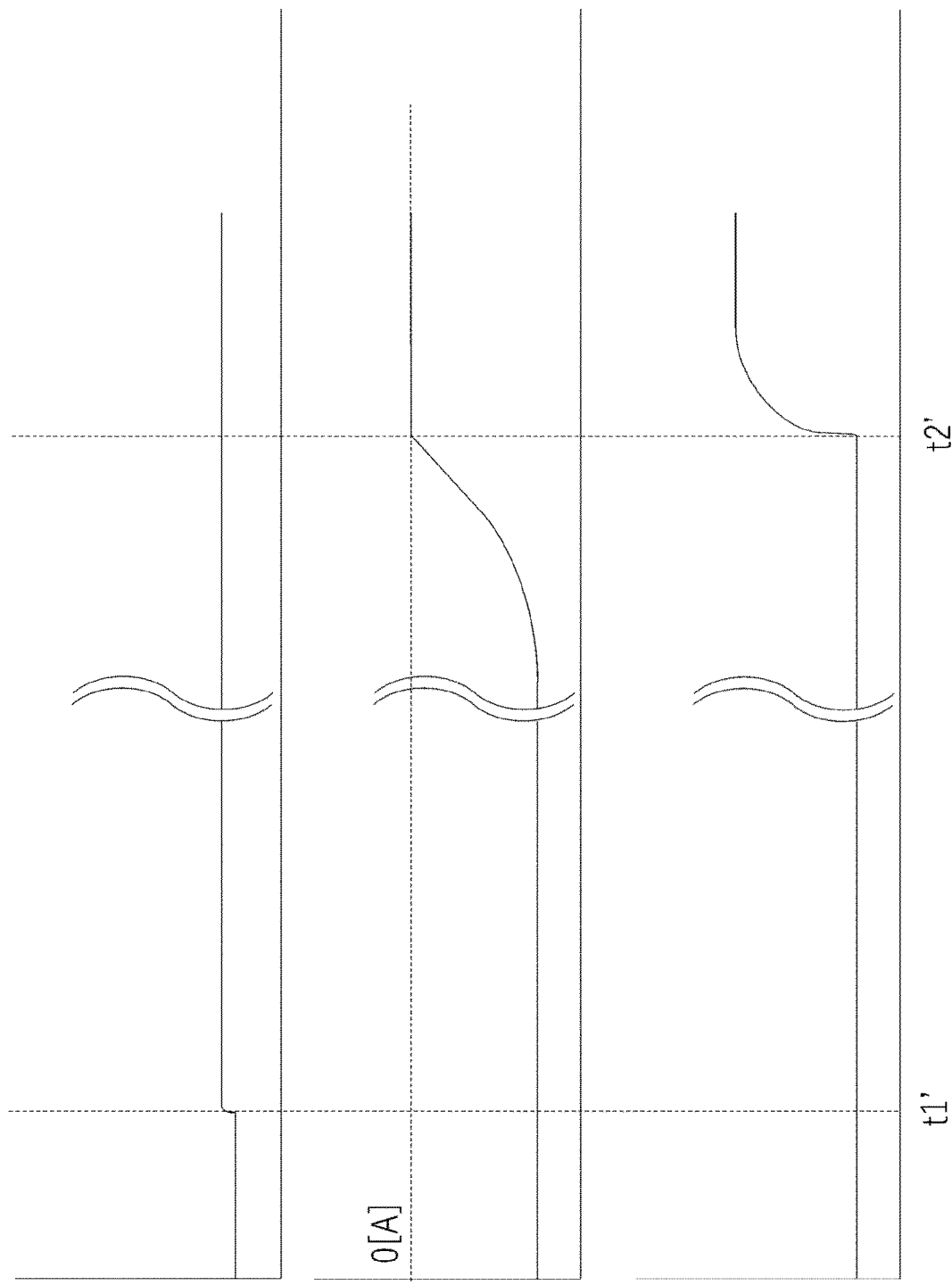
FIGS. 4, 5, and 6 are superimposed one on another.
Figure 5:
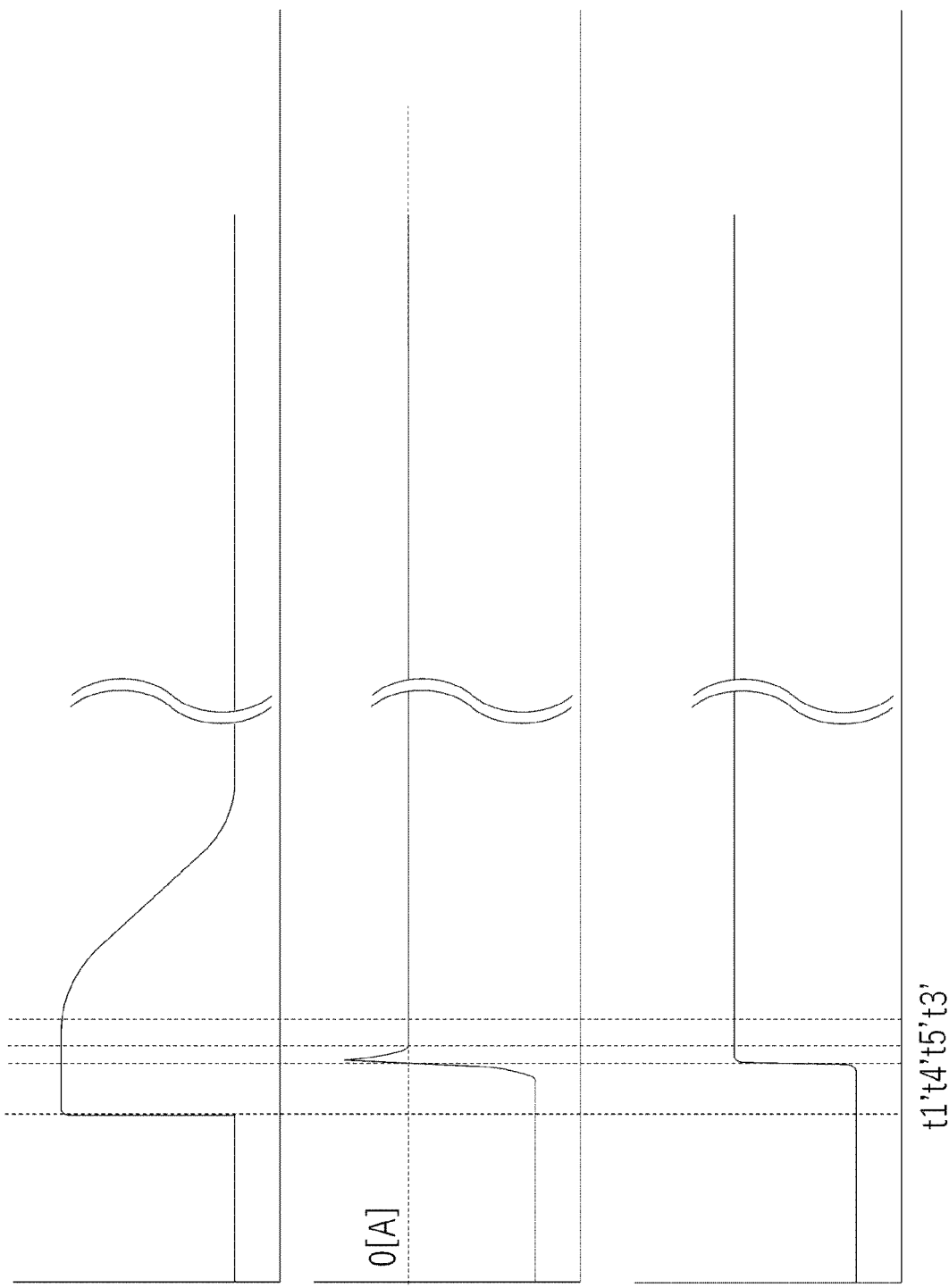
Figure 6:
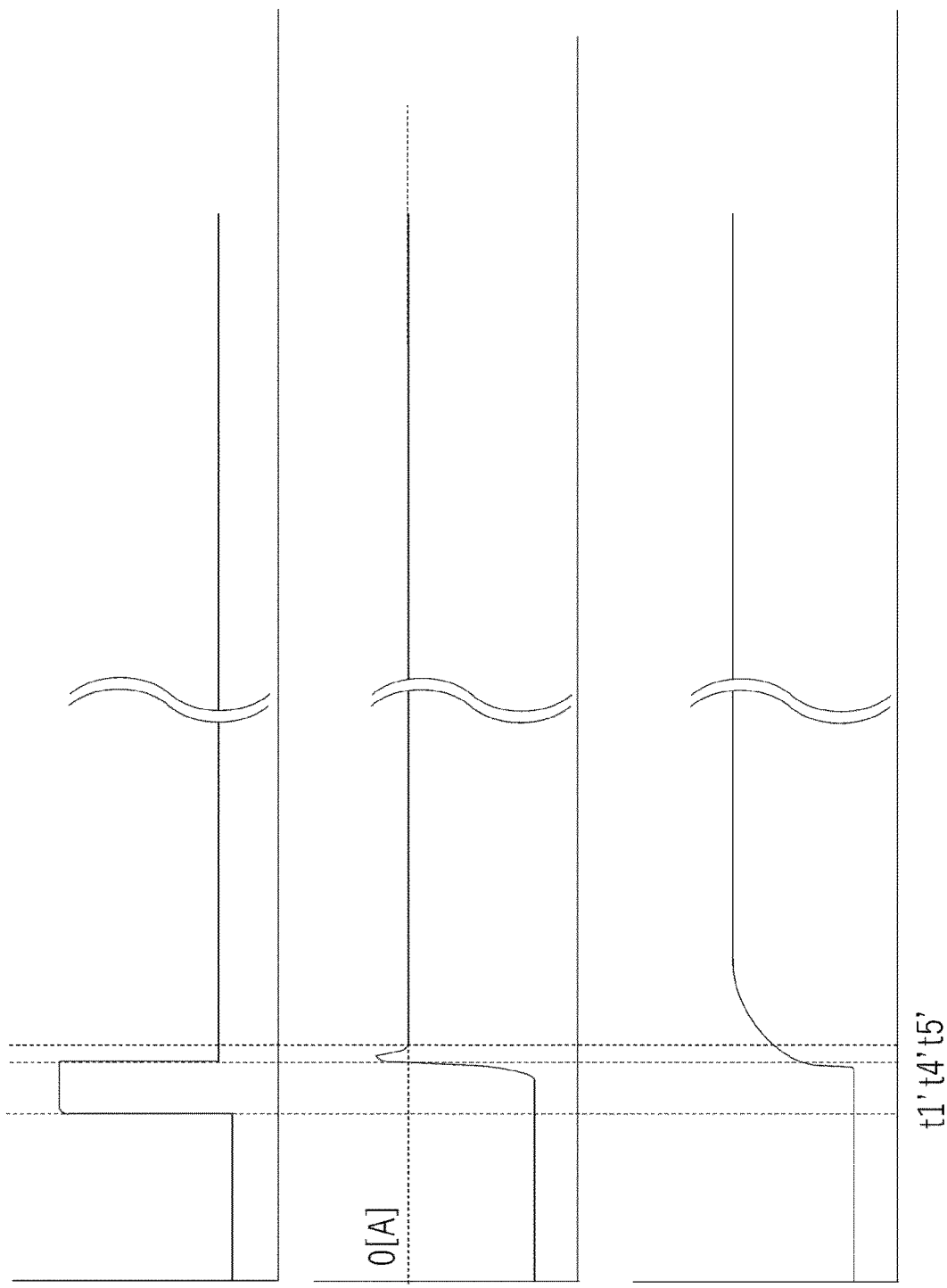
Figure 7:
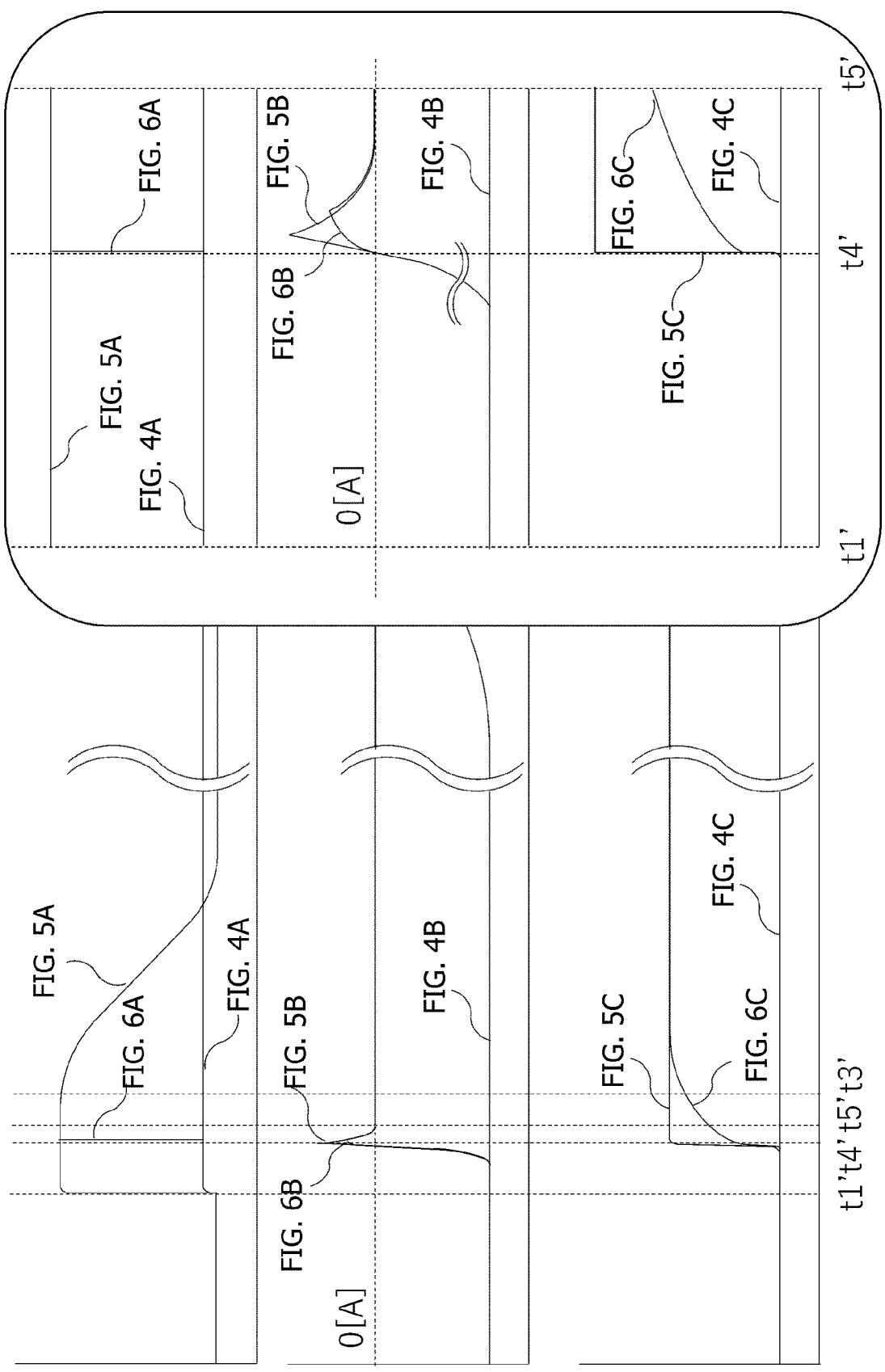

FIG. 7 is a diagram in which the waveforms of FIG. 4 to FIG. 6 are superimposed one on another and has, in a right frame, a diagram in which the part from the clock time t1' to the clock time t5' is enlarged. The second comparator 16 detects that the current has become zero at the clock time t4', and the slew rate of the high-side transistor 2 is adjusted to be low. Due to this, the peak value of the reverse current is suppressed compared with the case in which the drive device 1 operates with the slew rate remaining high. Further, the possibility that ringing is caused is suppressed due to the gentle rise of the voltage at the node Load.

The description has been made thus far by taking the example in which the high-side transistor 2 makes a transition from the off-state to the on-state. However, the same applies also to the case in which the low-side transistor 3 makes a transition from the off-state to the on-state. The first comparator 15 detects the current of the body diode of the high-side transistor 2, and the logic part 17 adjusts the slew rate of the low-side transistor 3 according to the result thereof.

Application to Vehicle

Figure 8:
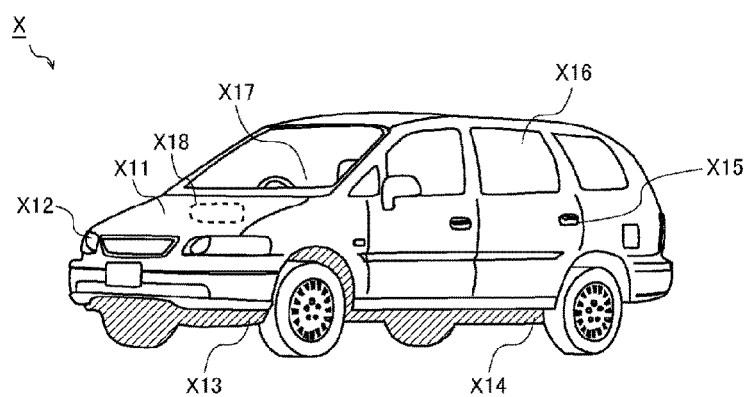
FIG. 8 is an external appearance diagram of a vehicle.

FIG. 8 is an external appearance diagram illustrating one configuration example of a vehicle. A vehicle X of the present configuration example includes a battery (not illustrated in this diagram) and various pieces of electronic equipment X11 to X18 that receive power supply from the battery to operate. The mounting positions of the pieces of electronic equipment X11 to X18 in this diagram are different from the actual ones in some cases for convenience of diagrammatic representation.

The electronic equipment X11 is an engine control unit that carries out control relating to an engine (for example, injection control, electronic throttle control, idling control, oxygen sensor heater control, and auto cruise control).

The electronic equipment X12 is a lamp control unit that carries out lighting-on/off control of a high intensity discharge (HID) lamp, and a daytime running lamp (DRL), for example.

The electronic equipment X13 is a transmission control unit that carries out control relating to transmission.

The electronic equipment X14 is a body control unit that carries out control relating to motion of the vehicle X (for example, anti-lock brake system (ABS) control, electronic power steering (EPS) control, and electronic suspension control).

The electronic equipment X15 is a security control unit that carries out driving control of a door lock and a security alarm, for example.

The electronic equipment X16 includes pieces of electronic equipment incorporated in the vehicle X at the stage of factory shipment as pieces of standard equipment and manufacturer optional extras, such as a wiper, an electric door mirror, a power window, a damper (shock absorber), an electric sunroof, and an electric seat.

The electronic equipment X17 includes pieces of electronic equipment optionally mounted on the vehicle X as user optional extras, such as in-vehicle audio/visual (A/V) equipment, a car navigation system, and an electronic toll collection (ETC) system.

The electronic equipment X18 includes pieces of electronic equipment having a high breakdown voltage motor, such as an in-vehicle blower, an oil pump, a water pump, and a battery cooling fan.

The drive device 1 described above can be incorporated in any of the pieces of electronic equipment X11 to X18 in which a load is driven.

Other Modification Examples

Further, besides the above-described embodiment, various changes can be added to various technical characteristics disclosed in the present specification without departing from the gist of technical creation thereof. That is, it should be considered that the above-described embodiment is exemplification in all points and is not restrictive, and it should be understood that the technical scope of the present technology is indicated not by the explanation of the above-described embodiment but by the scope of claims and all changes that belong to meanings and range equivalent to the scope of claims are included therein. For example, in the present embodiment, a comparator is used on the basis of the values of the voltages at the node OUT and the node Load for detection of the reverse current. However, the source-drain voltage of the high-side transistor 2 and the low-side transistor 3 may be monitored.

What is claimed is:

1. A drive device, comprising:
  a driver configured to drive a high-side transistor and a low-side transistor;
  a first current detecting part that:
    detects one of an upper-side current that flows to the high-side transistor and a lower-side current that flows to the low-side transistor, and
    generates a voltage between an upper end and a lower end of the first current detecting part;
  a current sense amplifier that transmits a logic signal based on the voltage generated between the upper end and the lower end of the first current detecting part;
  a first current determining part that detects a sign of switching of a forward direction/reverse direction of the upper-side current or the lower-side current detected by the first current detecting part or the switching per se; and
  a logic part including:
    a logic control part configured to:
      receive the logic signal transmitted by the current sense amplifier, and control the driver based on the received logic signal; and a slew rate adjusting part configured to control the driver such that a slew rate of the high-side transistor or the low-side transistor is adjusted according to a determination result of the first current determining part.

2. The drive device according to claim 1, wherein the first current detecting part is a first detection resistor, and the first current determining part includes a first comparator that compares a voltage generated at one end of the first detection resistor and a voltage generated at an other end of the first detection resistor.

3. The drive device according to claim 2, wherein the first detection resistor is an integrated wiring resistor.

4. The drive device according to claim 2, wherein the first detection resistor is not integrated but externally mounted.

5. The drive device according to claim 1, further comprising:

a second current detecting part that detects remaining current that is not detected by the first current detecting part in the upper-side current and the lower-side current.

6. The drive device according to claim 5, further comprising:

a second current determining part that detects a sign of switching of a forward direction/reverse direction of the upper-side current or the lower-side current detected by the second current detecting part or the switching per se.

7. The drive device according to claim 6, wherein the second current detecting part is a second detection resistor, and the second current determining part includes a second comparator that compares a voltage generated at one end of the second detection resistor and a voltage generated at the other end of the second detection resistor.

8. The drive device according to claim 7, wherein the second detection resistor is an integrated wiring resistor.

9. The drive device according to claim 7, wherein the second detection resistor is not integrated but externally mounted.

10. The drive device according to claim 5, wherein the current sense amplifier further senses the upper-side current and the lower-side current by using the first current detecting part and the second current detecting part.

11. A vehicle comprising:

the drive device according to claim 1.

* * * * *